(12) United States Patent
Yang et al.

(10) Patent No.: US 10,459,555 B2
(45) Date of Patent: Oct. 29, 2019

(54) IN-CELL TOUCH PANEL, DRIVING METHOD THEREOF AND DISPLAY DEVICE

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Yingming Liu, Beijing (CN); Weijie Zhao, Beijing (CN); Xiaoliang Ding, Beijing (CN); Hongjuan Liu, Beijing (CN); Changfeng Li, Beijing (CN); Pengpeng Wang, Beijing (CN); Wei Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/525,781

(22) PCT Filed: Oct. 24, 2016

(86) PCT No.: PCT/CN2016/103103
§ 371 (c)(1),
(2) Date: May 10, 2017

(87) PCT Pub. No.: WO2017/071543
PCT Pub. Date: May 4, 2017

(65) Prior Publication Data
US 2018/0018052 A1    Jan. 18, 2018

(30) Foreign Application Priority Data
Oct. 26, 2015 (CN) ............ 2015 1 0702560

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ......... H01L 27/323; G06F 2203/04105; G06F 3/0414; G02F 1/133512
See application file for complete search history.

(56) References Cited

U.S. PATENT DOCUMENTS

2014/0353691 A1* 12/2014 Lee ................ H01L 27/323
257/88
2014/0354585 A1    12/2014 Cok et al.
(Continued)

FOREIGN PATENT DOCUMENTS

CN    101635304 A    1/2010
CN    103258840 A    8/2013
(Continued)

OTHER PUBLICATIONS

Feb. 7, 2017—(WO) International Search Report and Written Opinion Appn PCT/CN2016/103103 with English Tran.
(Continued)

*Primary Examiner* — Dong Hui Liang
(74) *Attorney, Agent, or Firm* — Banner & Witcoff, Ltd.

(57) ABSTRACT

An in-cell touch panel, driving method thereof and display device are provided. The in-cell touch panel includes: a base substrate; an opposing substrate arranged opposite to the base substrate; a plurality of organic light-emitting diode pixel units disposed on a side of the base substrate facing the opposing substrate, wherein each of the OLED pixel units
(Continued)

include an anode layer; a pressure-sensitive detection chip; and a plurality of mutually independent pressure-sensitive detection electrodes disposed between the cathode layer and the opposing substrate, wherein a capacitor structure is formed by the pressure-sensitive detection electrodes and the cathode layer, wherein the pressure-sensitive detection chip is configured to determine a pressure value at a touch position by detecting a capacitance variation between the pressure-sensitive detection electrodes and the cathode layer.

14 Claims, 5 Drawing Sheets

(51) Int. Cl.
*G06F 3/044* (2006.01)
*H01L 51/52* (2006.01)

(52) U.S. Cl.
CPC ........ *H01L 27/323* (2013.01); *H01L 27/3265* (2013.01); *H01L 51/5221* (2013.01); *G06F 2203/04105* (2013.01)

(56) References Cited

U.S. PATENT DOCUMENTS

| | | | | |
|---|---|---|---|---|
| 2014/0362028 | A1* | 12/2014 | Mo | G06F 3/044 |
| | | | | 345/174 |
| 2015/0153887 | A1* | 6/2015 | Kim | G06F 3/044 |
| | | | | 345/173 |
| 2016/0147375 | A1* | 5/2016 | Bok | G06F 3/0421 |
| | | | | 345/175 |
| 2017/0075493 | A1* | 3/2017 | Lee | G06F 3/0418 |

FOREIGN PATENT DOCUMENTS

| | | |
|---|---|---|
| CN | 104252070 A | 12/2014 |
| CN | 204965387 U | 1/2016 |
| CN | 205038623 U | 2/2016 |
| CN | 205038626 U | 2/2016 |
| CN | 205121513 U | 3/2016 |

OTHER PUBLICATIONS

Apr. 1, 2019—(CN) First Office Action Appn 201510702560.6 with English Translation.

* cited by examiner

IN-CELL TOUCH PANEL, DRIVING METHOD THEREOF AND DISPLAY DEVICE

The application is a U.S. National Phase Entry of International Application No. PCT/CN2016/103103 filed on Oct. 24, 2016, designating the United States of America and claiming priority to Chinese Patent Application No. 201510702560.6, filed on Oct. 26, 2015. The present application claims priority to and the benefit of the above-identified applications and the above-identified applications are incorporated by reference herein in their entirety.

TECHNICAL FIELD

The present disclosure relates to an in-cell touch panel, a driving method thereof and a display device.

BACKGROUND

Pressure-sensitive technology is a technology capable of detecting an external force. The technology has been applied in the industrial, medical and other fields a long time ago. Currently, the pressure sensing in the display field, particularly in the field of mobile phones or tablet PCs, is achieved by adding an additional mechanism on a backlight portion of a liquid crystal display (LCD) panel or a middle-bezel portion of a mobile phone. The design requires the modification of the structural design of the LCD panel or the mobile phone. Moreover, due to large fit tolerance, the detection accuracy of the design is also limited.

Therefore, how to achieve pressure sensing with high detection accuracy in the case of small modification on hardware of the display panel is a problem to be solved by those skilled in the art.

SUMMARY

One embodiment of the disclosure provides an in-cell touch panel, comprising: a base substrate; an opposing substrate arranged opposite to the base substrate; a plurality of organic light-emitting diode (OLED) pixel units disposed on a side of the base substrate facing the opposing substrate and arranged in a matrix, wherein each of the OLED pixel units include an anode layer, an emission layer (EML) and a cathode layer disposed on the base substrate in sequence; a pressure-sensitive detection chip; and a plurality of mutually independent pressure-sensitive detection electrodes disposed between the cathode layer and the opposing substrate, wherein a capacitor structure is formed by the pressure-sensitive detection electrodes and the cathode layer, wherein the pressure-sensitive detection chip is configured to apply pressure-sensitive detection signals to the pressure-sensitive detection electrodes in a pressure-sensitive touch period, and determine a pressure value at a touch position by detecting a capacitance variation between the pressure-sensitive detection electrodes and the cathode layer.

Another embodiment of the disclosure provides a display device comprising the in-cell touch panel as mentioned above.

Another embodiment of the disclosure provides a driving method of the above in-cell touch panel, wherein one frame of time at least includes a display period and a pressure-sensitive touch period; in the display period, the pressure-sensitive detection chip does not apply signals to the pressure-sensitive detection electrodes; and in the pressure-sensitive touch period, the pressure-sensitive detection chip applies the pressure-sensitive detection signals to the pressure-sensitive detection electrodes, and determines the pressure value at the touch position by detecting the capacitance variation between the pressure-sensitive detection electrodes and the cathode layer.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

The thickness and the shape of layers in the accompanying drawings do not reflect the true scale and are only intended to illustrate the content of the present disclosure.

Figure 1:
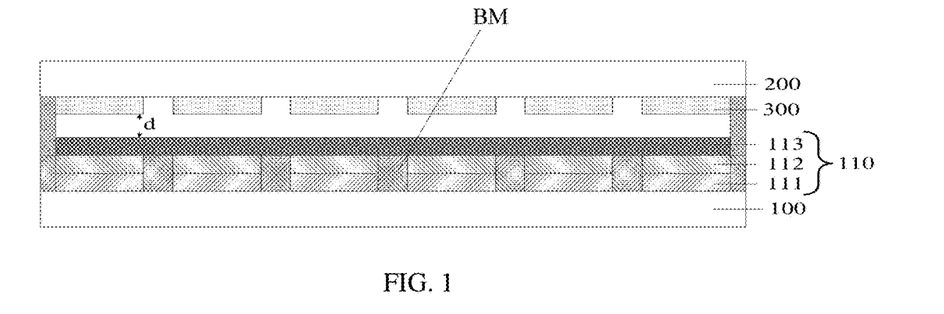
FIG. 1 is a schematic structural view of an in-cell touch panel provided by the embodiment of the present disclosure.

The embodiment of the present disclosure provides an in-cell touch panel, which, as illustrated in FIG. 1, comprises: a base substrate 100, an opposing substrate 200 arranged opposite to the base substrate 100, and a plurality of organic light-emitting diode (OLED) pixel units 110 disposed on a side of the base substrate 100 facing the opposing substrate 200 and arranged in a matrix, wherein the OLED pixel units 110 include an anode layer 111, an emission layer (EML) 112 and a cathode layer 113 disposed on the base substrate in sequence.

The in-cell touch panel further comprises a pressure-sensitive detection chip (not illustrated in FIG. 1) and a plurality of mutually independent pressure-sensitive detection electrodes 300 disposed between the cathode layer 113 and the opposing substrate 200.

A capacitor structure is formed by the pressure-sensitive detection electrodes 300 and the cathode layer 113.

The pressure-sensitive detection chip is configured to apply pressure-sensitive detection signals to the pressure-sensitive detection electrodes 300 in the pressure-sensitive touch period, and determine the pressure value at a touch position by detecting the capacitance variation between the pressure-sensitive detection electrodes 300 and the cathode layer 113.

In the in-cell touch panel provided by the embodiment of the present disclosure, the pressure-sensitive detection electrodes are additionally arranged between the cathode layer of the OLED pixel units and the opposing substrate, so that the capacitor structure is formed by the pressure-sensitive detection electrodes and the cathode layer; and when the position of the pressure-sensitive detection electrode is pressed, the distance between the pressure-sensitive detection electrode and the cathode layer changes, and hence the capacitance between the pressure-sensitive detection electrode and the cathode layer is varied along with the change. Therefore, the pressure-sensitive touch function can be achieved by additionally arranging the pressure-sensitive detection chip to apply the pressure-sensitive detection signals to the pressure-sensitive detection electrodes in the pressure-sensitive touch period and determine the pressure value at the touch position by detecting the capacitance variation between the pressure-sensitive detection electrodes and the cathode layer. Moreover, in the in-cell touch panel provided by the embodiment of the present disclosure, the cathode layer is multiplexed in the pressure-sensitive touch period, and the pressure-sensitive detection electrodes are integrated into the touch panel. Thus, the modification on the structural design of a display device is small; the limitation of the fit tolerance can be avoided; better detection accuracy can be achieved; and the production cost can be saved.

It should be noted that: in the in-cell touch panel provided by the embodiment of the present disclosure, the OLED pixel units adopt top-emission type, namely light emitted by the OLED pixel units is emitted from the side of the cathode layer.

For example, in the in-cell touch panel provided by the embodiment of the present disclosure, as illustrated in FIG. 1, the spacing between the pressure-sensitive detection electrodes 300 and the cathode layer 113 which form the capacitor structure is d. In the capacitance formula: $C=\varepsilon S/4\pi kd$, C refers to the capacitance of the capacitor structure formed by the pressure-sensitive detection electrodes 300 and the cathode layer 113; $\varepsilon$ refers to the dielectric constant of insulating dielectric at the position of the spacing d; S refers to the overlapping area of the capacitor structure formed by the pressure-sensitive detection electrodes 300 and a conducting layer 400; k refers to the electrostatic constant; and d refers to the spacing between the pressure-sensitive detection electrodes 300 and the conducting layer 400. When the position of the pressure-sensitive detection electrode 300 is pressed, the spacing d is reduced. In this case, the capacitance formed between the pressure-sensitive detection electrode 300 and the cathode layer 113 will be increased, and hence the pressure value can be determined by detecting the capacitance variation.

Figure 2:
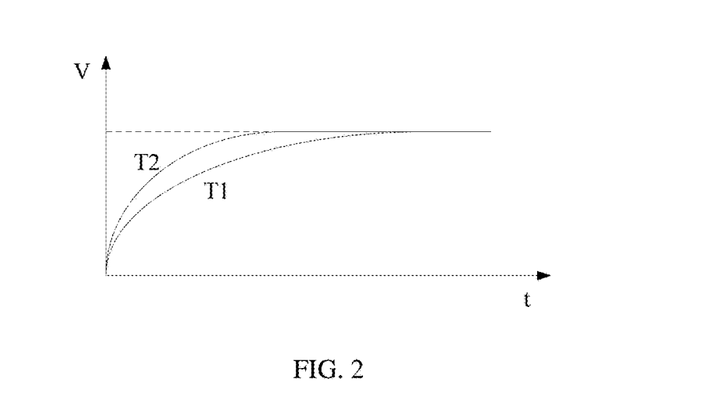
FIG. 2 is a coordinate diagram illustrating the relationship between the charging time and the voltage of a pressure-sensitive detection electrode in the in-cell touch panel provided by the embodiment of the present disclosure.

Moreover, in the charging formula of a capacitor: $Vt=V0+(Vu-V0)*[1-\exp(-t/RC)]$, Vt refers to the voltage on the capacitor at any time t; V0 refers to the initial voltage on the capacitor; Vu refers to the final voltage after the capacitor is fully charged; and RC refers to the time constant of a resistance-capacitance (RC) circuit. In the capacitor structure formed by the pressure-sensitive detection electrodes and the cathode layer, the capacitance of the capacitor structure under different touch pressures is different, so the charging time of the capacitor structure is different. The pressure-sensitive detection chip may determine the pressure value by detecting the capacitance variation by the means of detecting the difference of the charging time. For example, in the pressure-sensitive detection period, the pressure-sensitive detection chip applies the pressure-sensitive detection signals to the pressure-sensitive detection electrodes, so that coupling capacitance can be produced by the capacitor structure formed by the pressure-sensitive detection electrodes and the cathode layer. Due to the RC delay of the signals, as illustrated in FIG. 2, in which the horizontal axis represents the time t and the vertical axis represents the voltage V at two ends of the capacitor structure, supposing that the charging time of the capacitor structure in the case of no touch pressure is T1, when touch pressure is applied, the distance between the pressure-sensitive detection electrodes and the cathode layer is reduced, so that the capacitance C of the capacitor structure can be increased, and corresponding charging time can be increased to be T2. Therefore, the pressure-sensitive detection chip may indirectly reflect the pressure value at the touch position by detecting the variation of the charging time of the capacitor structure formed by the pressure-sensitive detection electrodes and the cathode layer, so that the in-cell touch panel can achieve the pressure-sensitive touch function.

For example, in the in-cell touch panel provided by the embodiment of the present disclosure, in order to reduce the mutual interference in the display period and the pressure-sensitive touch period, the time-sharing driving means in the display period and the pressure-sensitive touch period is usually adopted. Moreover, in some examples, a display drive chip for display and the pressure-sensitive detection chip may also be integrated into a chip, so that the production cost can be further reduced.

Moreover, in some examples, in the in-cell touch panel provided by the embodiment of the present disclosure, the pressure-sensitive detection electrodes may be specifically disposed on a side of the base substrate facing the opposing substrate and may also be disposed on a side of the opposing substrate facing the base substrate. No limitation will be given here. Description will be given in FIG. 1 by taking the case that the pressure-sensitive detection electrodes 300 are disposed on a side of the opposing substrate 200 facing the base substrate 100 as an example.

For example, in the in-cell touch panel provided by the embodiment of the present disclosure, when the pressure-sensitive detection electrodes are disposed on the side of the base substrate facing the opposing substrate, in order to form the capacitor structure by the pressure-sensitive detection electrodes and the cathode layer, an insulating layer is further disposed between the pressure-sensitive detection electrodes and the cathode layer; and when the pressure-sensitive detection electrodes are disposed on the side of the opposing substrate facing the base substrate, air may be adopted as a dielectric layer between the pressure-sensitive detection electrodes and the cathode layer, and of course, in order to achieve the function of supporting the opposing substrate, an insulating layer may further be disposed between the pressure-sensitive detection electrodes and the cathode layer.

Moreover, in some examples, in the in-cell touch panel provided by the embodiment of the present disclosure, as illustrated in FIG. 1, the pressure-sensitive detection electrodes 300 may be multiplexed as self-capacitive electrodes; and the pressure-sensitive detection chip is also configured to apply capacitance detection signals to the pressure-sensitive detection electrodes 300 in the capacitive touch period and determine the touch position by detecting the capacitance variation of the pressure-sensitive detection electrodes 300, so that the in-cell touch panel can achieve the capacitive touch function. As the pressure-sensitive detection electrodes are multiplexed as the self-capacitive electrodes, the process of additionally manufacturing the self-capacitive electrodes is not required, so that the production cost can be saved and the production efficiency can be improved.

As the pressure-sensitive detection electrodes are also multiplexed as the self-capacitive electrodes, the capacitive touch function is achieved. In order to reduce the mutual interference of signals in the display period, the capacitive touch period and the pressure-sensitive touch period, in some examples, the time-sharing driving means in the display period, the capacitive touch period and the pressure-sensitive touch period is adopted, and the pressure-sensitive detection chip is adopted to respectively provide the capacitance detection signals and the pressure-sensitive detection signals in the capacitive touch period and the pressure-sensitive touch period.

Moreover, in some examples, in the in-cell touch panel provided by the embodiment of the present disclosure, as illustrated in FIG. 1, the pressure-sensitive detection electrodes 300 are arranged in the same layer. In this way, patterns of the pressure-sensitive detection electrodes 300 may be formed by only one patterning process in the manufacturing process. Thus, the manufacturing process can be simplified; the production cost can be reduced; and the production efficiency can be improved. In some examples, the pressure-sensitive detection electrodes may also be arranged in different layers. No limitation will be given here.

Moreover, in some examples, in the in-cell touch panel provided by the embodiment of the present disclosure, the materials of the pressure-sensitive detection electrodes may be transparent conductive materials, for example, may be indium tin oxide (ITO) materials, indium zinc oxide (IZO) materials, carbon nanotubes, graphene or the like; and may also be metallic materials. No limitation will be given here.

In the in-cell touch panel provided by the embodiment of the present disclosure, when the materials of the pressure-sensitive detection electrodes are transparent conductive materials, an orthographic projection of each of the pressure-sensitive detection electrodes on the base substrate covers at least one OLED pixel unit. For example, the pattern of the pressure-sensitive detection electrode may be a regular pattern such as square, rectangle and circle, and of course, may also be an irregular pattern. No limitation will be given here.

As the pressure-sensitive detection electrodes are mutually independent, namely there is gap between two adjacent pressure-sensitive detection electrodes, the light transmittance at the gap between the adjacent pressure-sensitive detection electrodes is inconsistent with the light transmittance at the pressure-sensitive detection electrode, so that the display uniformity can be affected. Therefore, for the arrangement of the pressure-sensitive detection electrodes to not affect the uniformity of the light transmittance of the in-cell touch panel in the display process, in some examples, the in-cell touch panel provided by the embodiment of the present disclosure further comprises a black matrix (BM) layer disposed between the base substrate and the opposing substrate. Orthographic projections of the gaps between the pressure-sensitive detection electrodes on the base substrate fall within orthographic projections of the BM layer on the base substrate.

Moreover, in some examples, in the in-cell touch panel provided by the embodiment of the present disclosure, the BM layer, for example, may be disposed on a side of the base substrate facing the opposing substrate and may also be disposed on one side of the opposing substrate facing the base substrate. No limitation will be given here.

In the in-cell touch panel provided by the embodiment of the present disclosure, when the materials of the pressure-sensitive detection electrodes are metallic materials, for the additionally arranged pressure-sensitive detection electrodes to not affect the uniformity of the light transmittance of display regions, the patterns of the pressure-sensitive detection electrodes will generally be shielded by patterns of a BM layer, namely orthographic projections of the patterns of the pressure-sensitive detection electrodes on the array substrate fall within regions provided with the patterns of the BM layer.

Moreover, in some examples, the patterns of the pressure-sensitive detection electrodes are usually set to be latticed structures of which orthographic projections on the base substrate fall within the regions provided with the patterns of the BM layer. The latticed structures are formed by transverse strip structures having same extension direction with gate lines, and longitudinal strip structures having same extension direction with data lines, namely are equivalent to be disposed between a plurality of rows of OLED pixel units and a plurality of columns of OLED pixel units. Of course, the patterns of the pressure-sensitive detection electrodes may also be only set to be transverse strip structures or longitudinal strip structures. The patterns may be designed according to actual parameters. No limitation will be given here.

In addition, the BM layer may be disposed at the gaps between the plurality of OLED pixel units, so as to avoid the influence on the light transmittance.

In general, the touch density of the in-cell touch panel is usually in millimeters. Thus, in some examples, the density and the area of the pressure-sensitive detection electrodes may be selected according to the required pressure-sensitive touch density, so as to ensure the required touch accuracy. The touch density of the pressure-sensitive detection electrodes is usually in millimeters, and the density of the display is usually in micrometers. Therefore, one pressure-sensitive detection electrode will generally correspond to a plurality of OLED pixel units in the display.

Moreover, as a bezel region surrounding the display region in the in-cell touch panel is usually fixed on an outer frame of a display device, when a central region and a border region of the in-cell touch panel are pressed by the same force, the pressure-sensitive detection electrodes in the central region can more easily convert the pressure into the distance variation between the pressure-sensitive detection electrodes and the cathode layer, namely the central region is more sensitive to pressure sensing compared with the border region. Thus, in order to achieve relatively uniform accuracy of pressure sensing in the entire display region of the in-cell touch panel, in some examples, in the in-cell touch panel provided by the embodiment of the present disclosure, the occupied area of the regions provided with the pressure-sensitive detection electrodes on the base substrate (namely the area of the pressure-sensitive detection electrodes) may be gradually increased along the direction from the central region to the border region of the base substrate. In this way, as for peripheral regions with relatively poor accuracy of pressure sensing in the in-cell touch panel, when the area of the pressure-sensitive detection electrodes is increased, the capacitance of the pressure-sensitive detection electrodes may be relatively increased, and hence the capacitance variation will also be increased.

Figure 3A:
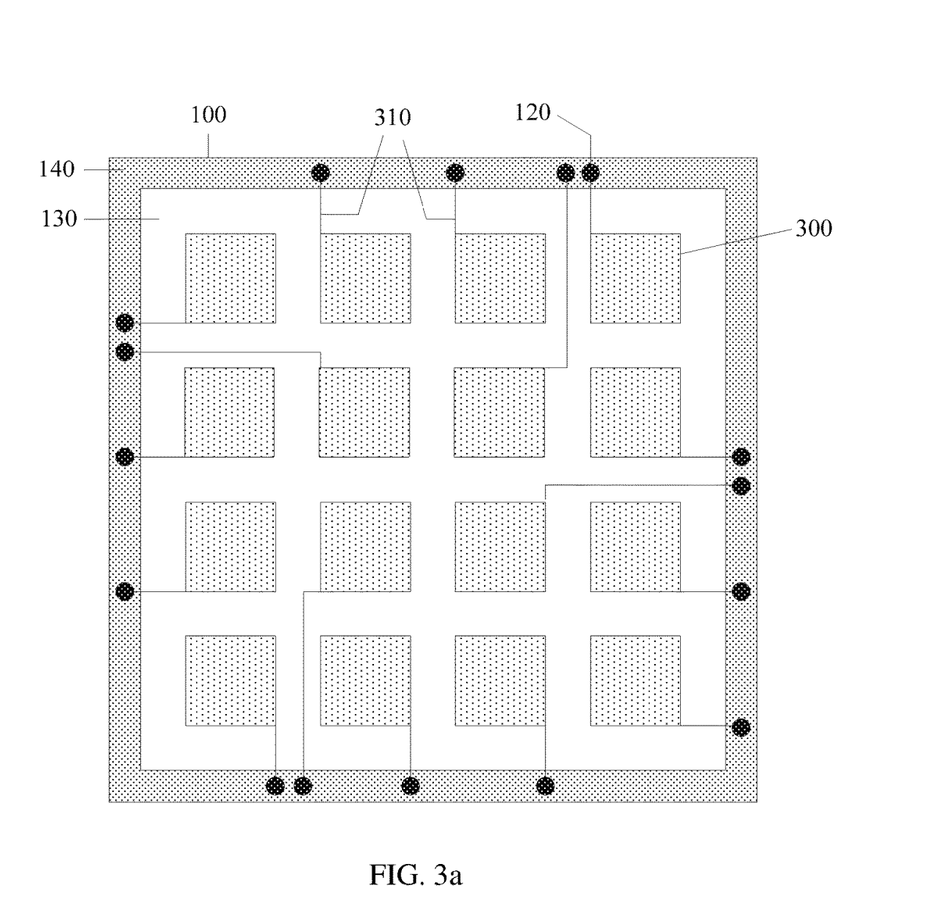
FIG. 3*a* is a schematic diagram 1 illustrating the distribution of conductive connection points in the in-cell touch panel provided by the embodiment of the present disclosure.
Figure 3B:
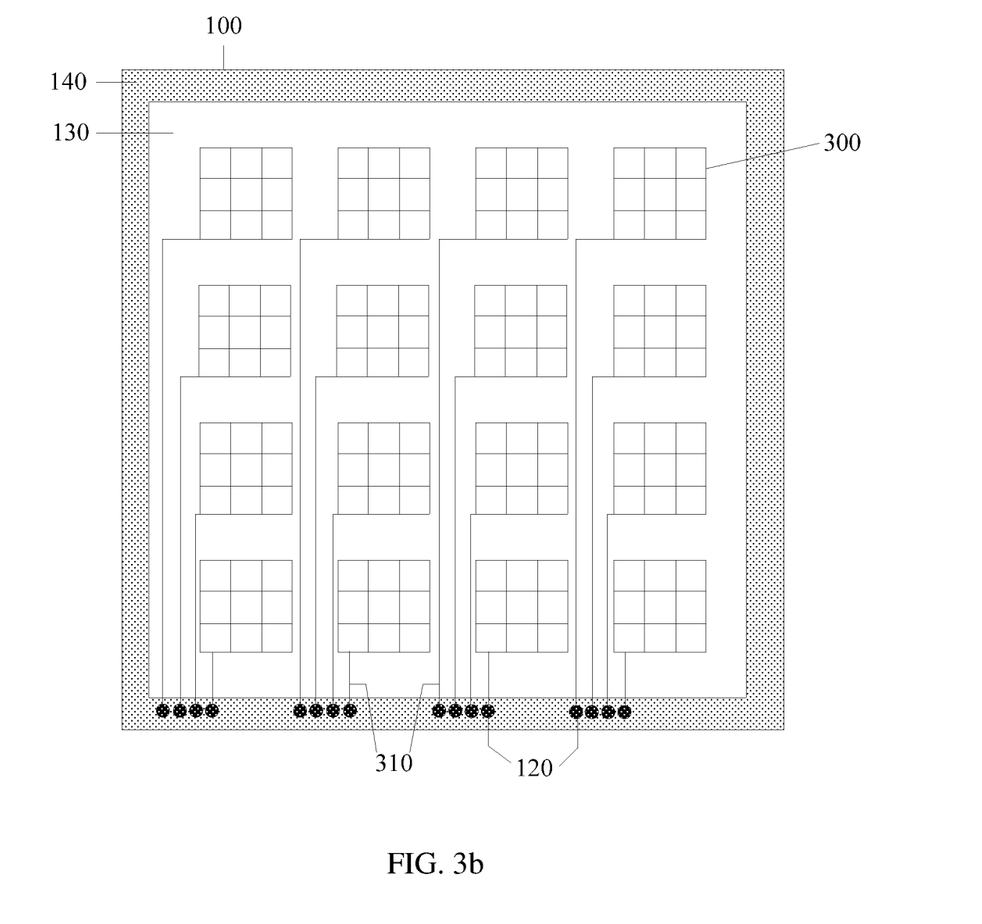
FIG. 3*b* is a schematic diagram 2 illustrating the distribution of conductive connection points in the in-cell touch panel provided by the embodiment of the present disclosure.

Moreover, the pressure-sensitive detection electrodes generally must be electrically connected with the pressure-sensitive detection chip through leads corresponding to the pressure-sensitive detection electrodes. Therefore, in some examples, as illustrated in FIGS. 3a and 3b, the in-cell touch panel provided by the embodiment of the present disclosure further comprises: leads 310 in one-to-one correspondence with the pressure-sensitive detection electrodes 300, and conductive connection points 120 in one-to-one correspondence with the pressure-sensitive detection electrodes 300. Orthographic projections of the leads 310 on the base substrate 100 fall within the orthographic projections of the BM layer on the base substrate 100; the conductive connection points 120 are disposed in a peripheral region 140 surrounding a display region 130 of the in-cell touch panel; and after being connected with the conductive connection points 120 through the leads 310, the pressure-sensitive detection electrodes 300 are electrically connected with the pressure-sensitive detection chip (not illustrated in both FIG. 3a and FIG. 3b) through metal wirings (not illustrated in both FIG. 3a and FIG. 3b) which are in one-to-one correspondence with the conductive connection points 120 and disposed in the peripheral region. Thus, the electric connection between the pressure-sensitive detection electrodes and the pressure-sensitive detection chip can be achieved, and the aperture opening ratio of the in-cell touch panel will not be affected by the leads.

Moreover, in some examples, in the in-cell touch panel provided by the embodiment of the present disclosure, as illustrated in FIG. 3a, the peripheral region 140 has four sides; the conductive connection points 120 are distributed on all the sides of the peripheral region 140; and the conductive connection points 120 corresponding to the pressure-sensitive detection electrodes 300 are distributed on the sides of the peripheral region 140 which are the closest to the pressure-sensitive detection electrodes 300. Thus, the signal attenuation in the leads can be reduced, so that the transmission stability of signals can be improved.

In some other examples, in the in-cell touch panel provided by the embodiment of the present disclosure, as illustrated in FIG. 3b, all the conductive connection points 120 are distributed on one side of the peripheral region 140. Thus, the leads are only required to be distributed along one direction, so that the manufacturing process can be simplified and the production efficiency can be improved.

Figure 4:
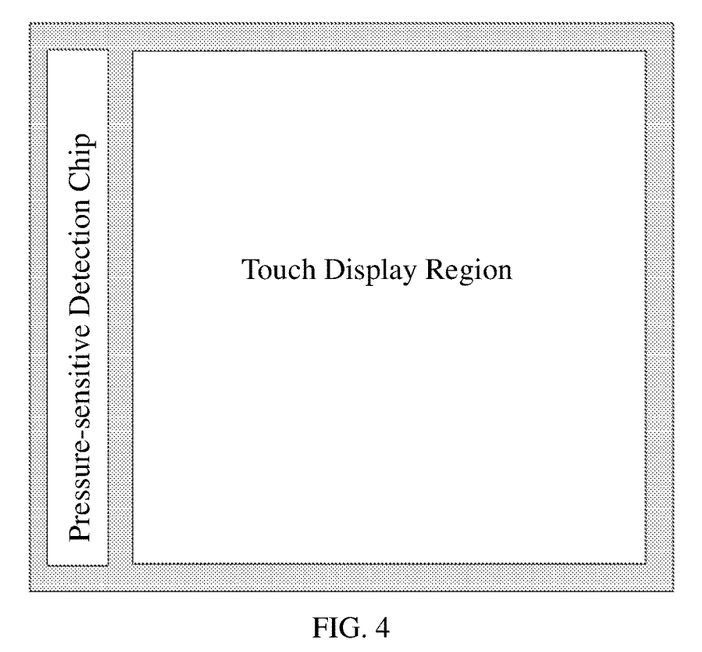
FIG. 4 is a schematic plan view of the in-cell touch panel provided by the embodiment of the present disclosure.

FIG. 4 is a schematic plan view of the in-cell touch panel provided by the embodiment of the present disclosure. As illustrated in FIG. 4, the pressure-sensitive detection chip is disposed at the peripheral region of the in-cell touch panel, namely disposed at the periphery region of the touch display panel. The case that the pressure-sensitive detection chip is disposed on a side of the touch display region is illustrated in FIG. 4 by way of example. But the embodiment of the present disclosure is not limited thereto. In addition, the pressure-sensitive touch chip may also be integrated with a gate driver, a source driver and the like for the display region.

Figure 5:
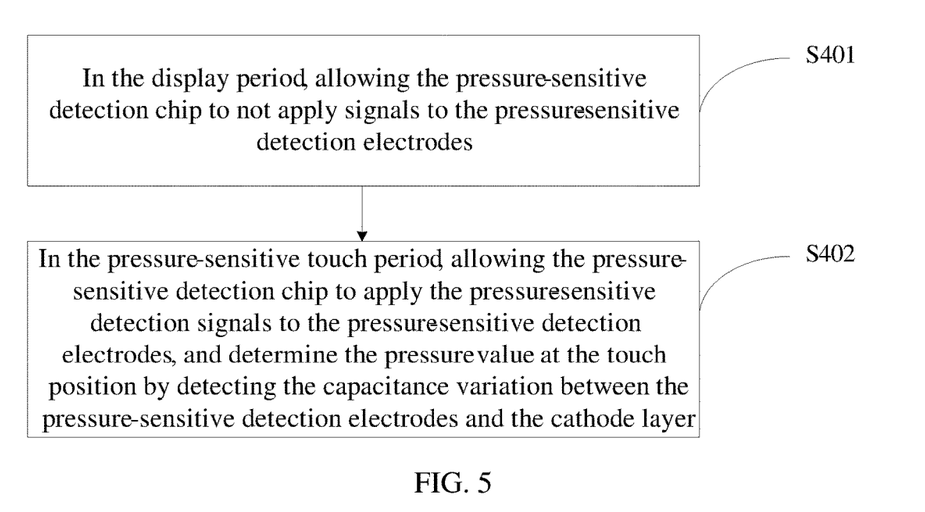
FIG. 5 is a flow diagram of a driving method of the in-cell touch panel, provided by the embodiment of the present disclosure.

On the basis of the same disclosure concept, the embodiment of the present disclosure further provides a driving method of the in-cell touch panel. As illustrated in FIG. 5, the time of one frame at least includes display period and pressure-sensitive touch period, and the method comprises the following steps S401 and S402.

S401: in the display period, allowing the pressure-sensitive detection chip to not apply signals to the pressure-sensitive detection electrodes; and S402: in the pressure-sensitive touch period, allowing the pressure-sensitive detection chip to apply the pressure-sensitive detection signals to the pressure-sensitive detection electrodes, and determine the pressure value at the touch position by detecting the capacitance variation between the pressure-sensitive detection electrodes and the cathode layer.

For example, in the pressure-sensitive touch period, the pressure-sensitive detection chip applies the pressure-sensitive detection signals to the pressure-sensitive detection electrodes, and meanwhile, applies a fixed voltage signal to the cathode layer. In this period, when the position of the pressure-sensitive detection electrode is pressed, the distance between the pressure-sensitive detection electrode and the cathode layer will change, so that the capacitance of the capacitor structure formed by the pressure-sensitive detection electrodes and the cathode layer will change, and hence the charging time of the capacitor will change. Therefore, the pressure-sensitive detection chip may determine the capacitance variation by detecting the change of the charging time of the capacitor of the pressure-sensitive detection electrode, and then determine the pressure value at the touch position, and hence achieve the pressure-sensitive touch function.

Moreover, as the pressure-sensitive detection electrodes are multiplexed as the self-capacitive electrodes, the capacitive touch function is achieved. In some examples, in the driving method provided by the embodiment of the present disclosure, the time of one frame further includes: capacitive touch period, wherein in the capacitive touch period, the pressure-sensitive detection chip applies capacitance detection signals to the pressure-sensitive detection electrodes and determines the touch position by detecting the capacitance variation of the pressure-sensitive detection electrodes.

For example, in the capacitive touch period, when the capacitance of the pressure-sensitive detection electrodes to ground electrodes (referring to other electrodes and signal lines on the base substrate except the pressure-sensitive detection electrodes) is larger, the accuracy of capacitive touch is lower. Thus, in order to ensure the accuracy of capacitive touch, in the capacitive touch period, the pressure-sensitive detection chip not only applies the capacitance detection signals to the pressure-sensitive detection electrodes but also may apply same capacitance detection signals to the ground electrodes corresponding to the pressure-sensitive detection electrodes, so that the base capacitance of the pressure-sensitive detection electrodes may theoretically be 0.

In some examples, in the driving method provided by the embodiment of the present disclosure, in order to better distinguish the pressure-sensitive touch period from the capacitive touch period, the pressure-sensitive detection signals and the capacitance detection signals select different signals, for example, the pressure-sensitive detection signals and the capacitance detection signals have different amplitudes. Of course, the pressure-sensitive detection signals and the capacitance detection signals may also be the same signals. No limitation will be given here.

Figure 6:
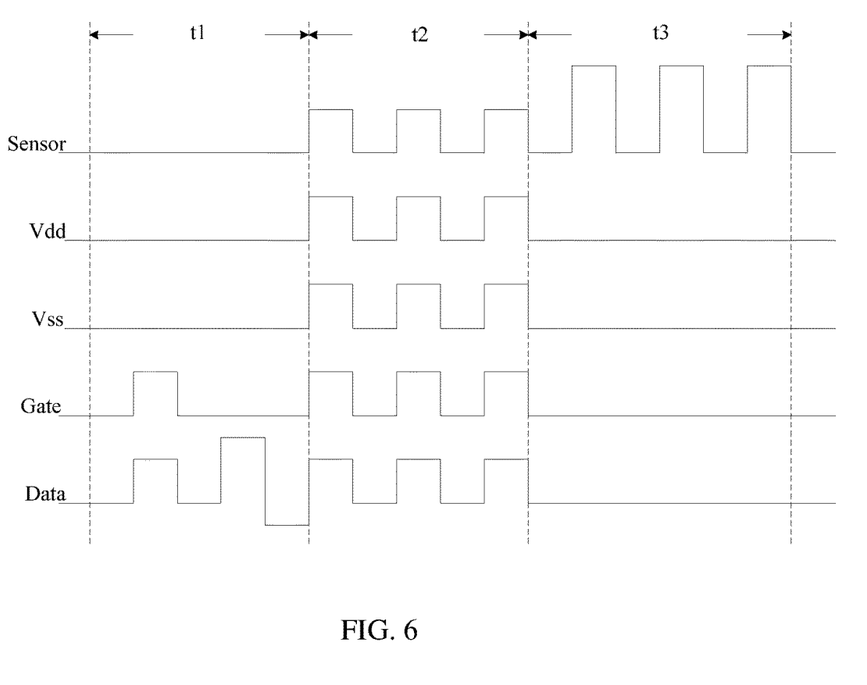
FIG. 6 is a drive timing diagram of the in-cell touch panel provided by the embodiment of the present disclosure.

Detailed description will be given below to the driving method provided by the embodiment of the present disclosure through the drive timing diagram of the time of one frame. FIG. 6 is only a timing diagram of a signal Sensor applied to the pressure-sensitive detection electrode within the time of one frame, a drive source signal Vdd of a pixel drive circuit of the OLED pixel unit, a signal Vss applied to the cathode layer, and a signal Gate applied to one gate line and a signal Data applied to one data line, in the ground electrode corresponding to the pressure-sensitive detection electrode. It should be noted that the embodiment is provided for better understanding of the present disclosure but not intended to limit the present disclosure.

In the drive timing diagram as illustrated in FIG. 6, the time of one frame includes: display period t1, capacitive period t2 and pressure-sensitive touch period t3.

In the display period t1, the pressure-sensitive detection electrodes are not applied with signals and are in the floating state. In addition, the signal Vss applied to the cathode layer, the signal Gate applied to the gate line and the signal Data applied to the data line are all the signals required in the normal display of the in-cell touch panel.

In the capacitive touch period t2, the signal Sensor applied to the pressure-sensitive detection electrode, the signal Vss applied to the cathode layer, the signal Gate applied to the gate line and the signal Data applied to the data line are all capacitance detection signals.

In the pressure-sensitive touch period t3, the signal Sensor applied to the pressure-sensitive detection electrode is a pressure-sensitive detection signal, and the signal Vss applied to the cathode layer, the signal Gate applied to the gate line and the signal Data applied to the data line are all fixed voltage signals.

On the basis of the same disclosure concept, the embodiment of the present disclosure further provides a display device, which comprises the in-cell touch panel provided by the embodiment of the present disclosure. The display device may be: any product or component with display function such as a mobile phone, a tablet PC, a television, a display, a notebook computer, a digital picture frame and a navigator. Other necessary components of the display device shall be understood by those skilled in the art to be included, will not be further described here, and shall not be construed as the limitation of the present disclosure. The embodiments of the display device may refer to the embodiments of the above package structure. No further description will be given here.

In the in-cell touch panel, the driving method thereof and the display device, provided by the embodiment of the present disclosure, the pressure-sensitive detection electrodes are additionally arranged between the cathode layer of the OLED pixel units and the opposing substrate, so that the capacitor structure is formed by the pressure-sensitive detection electrodes and the cathode layer. When the position of the pressure-sensitive detection electrode is pressed, the distance between the pressure-sensitive detection electrode and the cathode layer changes, and then the capacitance between the pressure-sensitive detection electrode and the cathode layer is varied along with the change. Therefore, the pressure-sensitive detection chip is additionally arranged to apply the pressure-sensitive detection signals to the pressure-sensitive detection electrodes in the pressure-sensitive touch period, and determine the pressure value at the touch position by detecting the capacitance variation between the pressure-sensitive detection electrodes and the cathode layer, and hence can achieve the pressure-sensitive touch function. Moreover, in the in-cell touch panel provided by the embodiment of the present disclosure, the cathode layer is multiplexed in the pressure-sensitive touch period, and the pressure-sensitive detection electrodes are integrated into the touch panel. Thus, the modification on the structural design of the display device is small; the limitation of the fit tolerance can be avoided; better detection accuracy can be achieved; and the production cost can be reduced.

The foregoing is only the preferred embodiments of the present disclosure and not intended to limit the scope of protection of the present disclosure. The scope of protection of the present disclosure should be defined by the appended claims.

The application claims priority to the Chinese patent application No. 201510702560.6, filed on Oct. 26, 2015, the disclosure of which is incorporated herein by reference as part of the application.

The invention claimed is:

1. An in-cell touch panel, comprising:
   a base substrate;
   an opposing substrate arranged opposite to the base substrate;
   a plurality of organic light-emitting diode (OLED) pixel units disposed on a side of the base substrate facing the opposing substrate and arranged in a matrix, wherein each of the OLED pixel units include an anode layer, an emission layer (EML) and a cathode layer disposed on the base substrate in sequence;
   a pressure-sensitive detection chip;
   a plurality of mutually independent pressure-sensitive detection electrodes disposed between the cathode layer and the opposing substrate, wherein a capacitor structure is formed by the pressure-sensitive detection electrodes and the cathode layer; and
   conductive connection points in one-to-one correspondence with the pressure-sensitive detection electrodes,
   wherein the pressure-sensitive detection chip is configured to apply pressure-sensitive detection signals to the pressure-sensitive detection electrodes in a pressure-sensitive touch period, and determine a pressure value at a touch position by detecting a capacitance variation between the pressure-sensitive detection electrodes and the cathode layer,
   a material of each of the pressure-sensitive detection electrodes is a transparent conductive material; and an orthographic projection of each of the pressure-sensitive detection electrodes on the base substrate covers at least one OLED pixel unit, and
   the in-cell touch panel further comprises: a black matrix (BM) layer disposed between the base substrate and the opposing substrate, and orthographic projections of gaps between the pressure-sensitive detection electrodes on the base substrate fall within an orthographic projection of the BM layer on the base substrate,
   the conductive connection points are disposed in a peripheral region surrounding a display region of the in-cell touch panel, the peripheral region has four sides, the conductive connection points are distributed on all the sides of the peripheral region, and the conductive connection points corresponding to the pressure-sensitive detection electrodes are distributed on the sides of the peripheral region which are the closest to the pressure-sensitive detection electrodes.

2. The in-cell touch panel according to claim 1, wherein the pressure-sensitive detection electrodes are multiplexed as self-capacitive electrodes; and
   the pressure-sensitive detection chip is further configured to apply capacitance detection signals to the pressure-sensitive detection electrodes in a capacitive touch period, and determine the touch position by detecting the capacitance variation of the pressure-sensitive detection electrodes.

3. The in-cell touch panel according to claim 2, wherein the pressure-sensitive detection electrodes are arranged in a same layer.

4. The in-cell touch panel according to claim 3,
wherein a material of each of the pressure-sensitive detection electrodes is a metallic material; and patterns of the pressure-sensitive detection electrodes are latticed structures of which orthographic projections on the base substrate fall within regions provided with patterns of the BM layer.

5. A display device, comprising the in-cell touch panel according to claim 1.

6. The display device according to claim 5, wherein the pressure-sensitive detection electrodes are multiplexed as self-capacitive electrodes; and
the pressure-sensitive detection chip is further configured to apply capacitance detection signals to the pressure-sensitive detection electrodes in a capacitive touch period, and determine the touch position by detecting the capacitance variation of the pressure-sensitive detection electrodes.

7. The display device according to claim 6, wherein the pressure-sensitive detection electrodes are arranged in a same layer.

8. A driving method of the in-cell touch panel according to claim 1, wherein one frame of time at least includes a display period and a pressure-sensitive touch period;
in the display period, the pressure-sensitive detection chip does not apply signals to the pressure-sensitive detection electrodes; and
in the pressure-sensitive touch period, the pressure-sensitive detection chip applies the pressure-sensitive detection signals to the pressure-sensitive detection electrodes, and determines the pressure value at the touch position by detecting the capacitance variation between the pressure-sensitive detection electrodes and the cathode layer.

9. The driving method according to claim 8, wherein the one frame of time further comprises: a capacitive touch period; and
in the capacitive touch period, the pressure-sensitive detection chip applies capacitance detection signals to the pressure-sensitive detection electrodes, and determines the touch position by detecting the capacitance variation of the pressure-sensitive detection electrodes.

10. The driving method according to claim 9, wherein in the pressure-sensitive touch period, a signal applied to the cathode layer is a capacitance detection signal; and in the capacitive touch period, the signal applied to the cathode layer is a fixed voltage signal.

11. The in-cell touch panel according to claim 1, wherein areas of the pressure-sensitive detection electrodes are gradually increased along a direction from a central region to a border region of the base substrate.

12. The in-cell touch panel according to claim 1, further comprising: leads in one-to-one correspondence with the pressure-sensitive detection electrodes, and conductive connection points in one-to-one correspondence with the pressure-sensitive detection electrodes, wherein
orthographic projections of the leads on the base substrate fall within the orthographic projection of the BM layer on the base substrate; the conductive connection points are disposed in a peripheral region surrounding a display region of the in-cell touch panel; and
after being connected with the conductive connection points through the leads, the pressure-sensitive detection electrodes are electrically connected with the pressure-sensitive detection chip through metal wirings which are in one-to-one correspondence with the conductive connection points and disposed in the peripheral region.

13. The in-cell touch panel according to claim 1, wherein the pressure-sensitive detection electrodes are disposed on a side of the opposing substrate facing the base substrate.

14. The in-cell touch panel according to claim 1, wherein the BM layer is disposed in regions opposite to gaps between the OLED pixel units.

* * * * *